(12) United States Patent
Otsuka et al.

(10) Patent No.: US 12,324,098 B2
(45) Date of Patent: Jun. 3, 2025

(54) CONNECTION STRUCTURE AND CONNECTION STRUCTURE MANUFACTURING METHOD

(71) Applicant: Murata Manufacturing Co., Ltd., Kyoto-fu (JP)

(72) Inventors: Yuma Otsuka, Nagaokakyo (JP); Sho Fujita, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 278 days.

(21) Appl. No.: 18/303,332

(22) Filed: Apr. 19, 2023

(65) Prior Publication Data

US 2023/0262895 A1    Aug. 17, 2023

Related U.S. Application Data

(63) Continuation of application No. PCT/JP2021/046258, filed on Dec. 15, 2021.

(30) Foreign Application Priority Data

Feb. 15, 2021    (JP) ................................ 2021-022031

(51) Int. Cl.
*H05K 1/18*        (2006.01)
*H05K 1/14*        (2006.01)
(Continued)

(52) U.S. Cl.
CPC ................. *H05K 1/14* (2013.01); *H05K 1/18* (2013.01); *H05K 3/28* (2013.01); *H05K 3/46* (2013.01);
(Continued)

(58) Field of Classification Search
CPC .. H05K 1/14; H05K 1/18; H05K 3/28; H05K 3/46; H05K 2201/0129; H05K 2201/10984
(Continued)

(56) References Cited

U.S. PATENT DOCUMENTS 10,624,215 B2 *    4/2020    Tanaka .................... H05K 3/321
11,355,484 B2 *    6/2022    Lin ........................ H10H 20/857
2009/0115071 A1 *  5/2009    Karashima .............. H01L 24/29
                                                       257/E23.06

FOREIGN PATENT DOCUMENTS

JP    H01-42193 A    2/1989
JP    2003-347722 A    12/2003
(Continued)

OTHER PUBLICATIONS

International Search Report issued in PCT/JP2021/046258; mailed Mar. 15, 2022.

*Primary Examiner* — Binh B Tran
(74) *Attorney, Agent, or Firm* — Studebaker Brackett PLLC

(57) ABSTRACT

A connection structure includes a first substrate having first and second principal surfaces opposed to each other and includes a first thermoplastic resin; a first substrate electrode on the first principal surface; a second substrate which has a third principal surface and a fourth principal surface opposed to the third principal surface and facing the first principal surface and includes a second thermoplastic resin; a second substrate electrode on the fourth principal surface; a conductive bonding material which bonds the first and second substrate electrodes together; and an insulating adhesive which adheres the first principal surface other than a portion where the first substrate electrode is and the fourth principal surface other than a portion where the second substrate electrode is together. A bonding temperature of the (Continued)

bonding material is lower than a respective melting point or a respective glass transition temperature of the first and second thermoplastic resins.

20 Claims, 7 Drawing Sheets

(51) Int. Cl.
 *H05K 3/28* (2006.01)
 *H05K 3/46* (2006.01)
(52) U.S. Cl.
 CPC ............... *H05K 2201/0129* (2013.01); *H05K 2201/10984* (2013.01)
(58) Field of Classification Search
 USPC ........................................................ 361/760
 See application file for complete search history.

(56) References Cited

FOREIGN PATENT DOCUMENTS

| JP | 2006-237233 A | 9/2006 |
| JP | 2012-186279 A | 9/2012 |
| JP | 2013-236036 A | 11/2013 |
| WO | 2008/149511 A1 | 12/2008 |

\* cited by examiner

CONNECTION STRUCTURE AND CONNECTION STRUCTURE MANUFACTURING METHOD

CROSS-REFERENCE TO RELATED APPLICATIONS

This application claims benefit of priority to International Patent Application No. PCT/JP2021/046258, filed Dec. 15, 2021, and to Japanese Patent Application No. 2021-022031, filed Feb. 15, 2021, the entire contents of each are incorporated herein by reference.

BACKGROUND

Technical Field

The present disclosure relates to a connection structure and connection structure manufacturing method.

Background Art

In recent years, in the fields of electric devices such as PCs and digital household electrical appliances, the field of automobiles, and so forth, reduction in size of products and an increase in performance have advanced. In accordance with these, reduction in size and an increase in density of a motherboard as an important electrical component in products of these types have been desired, and reduction in size of various components to be mounted on the motherboard has also been desired. Among these various components, a substrate for mounting an electronic component such as an IC chip is included. As this substrate, for example, a multilayered substrate with a plurality of substrates laminated has been used.

Japanese Unexamined Patent Application Publication No. 2006-237233 discloses a composite wiring substrate structure in which a conductor part is provided in an adhesive layer for adhering each substrate to electrically connect surface conductors arranged on each substrate. Specifically, Japanese Unexamined Patent Application Publication No. 2006-237233 discloses a composite wiring substrate structure including a first substrate which includes a first principal surface and a second principal surface and has an element mounting part set on the first principal surface side, the element mounting part to which a semiconductor circuit element is connectable, and a second substrate bonded via an adhesive layer to the second principal surface side of the first substrate. Also, a first surface conductor electrically continuous to a conductor part of the first substrate and a second surface conductor electrically continuous to a conductor part of the second substrate are electrically connected together via a conductor part in the adhesive layer.

SUMMARY

In Japanese Unexamined Patent Application Publication No. 2006-237233, as an adhesive layer for adhering the substrates together, a liquid-crystal polymer, thermoplastic polyimide, and polyether ether ketone are used. When the substrates are adhered together, thermocompression bonding is performed.

However, if each substrate to be connected is a flexible substrate including a thermoplastic resin and these substrates are adhered together by thermocompression bonding, the flexible substrates are softened by heat, and wiring patterns and substrate electrodes arranged on the substrates may be shifted or sink to cause connection failure to easily occur.

The present disclosure provides a connection structure in which each substrate is adhered and each substrate electrode arranged on each substrate is bonded, the connection structure being highly reliable with less connection failure among the respective substrate electrodes.

A connection structure of the present disclosure includes a first substrate which has a first principal surface and a second principal surface opposed to the first principal surface and includes a first thermoplastic resin; a first substrate electrode arranged on the first principal surface; a second substrate which has a third principal surface and a fourth principal surface opposed to the third principal surface and facing the first principal surface and includes a second thermoplastic resin; a second substrate electrode arranged on the fourth principal surface; a bonding material which is conductive and bonds the first substrate electrode and the second substrate electrode together; and an adhesive which has insulating properties and adheres the first principal surface other than a portion where the first substrate electrode is arranged and the fourth principal surface other than a portion where the second substrate electrode is arranged together. A bonding temperature of the bonding material is lower than a melting point or a glass transition temperature of the first thermoplastic resin and lower than a melting point or a glass transition temperature of the second thermoplastic resin. An adhesion temperature of the adhesive is lower than the melting point or the glass transition temperature of the first thermoplastic resin and lower than the melting point or the glass transition temperature of the second thermoplastic resin.

A connection structure manufacturing method of the present disclosure includes: a first substrate preparing step of preparing a first substrate which has a first principal surface and a second principal surface opposed to the first principal surface, includes a first substrate electrode on the first principal surface, and includes a first thermoplastic resin; a second substrate preparing step of preparing a second substrate which has a third principal surface and a fourth principal surface opposed to the third principal surface, includes a second substrate electrode on the fourth principal surface, and includes a second thermoplastic resin; a bonding step of bonding the first substrate electrode and the second substrate electrode together with a bonding material which is conductive; and an adhering step of adhering the first principal surface other than a portion where the first substrate electrode is arranged and the fourth principal surface other than a portion where the second substrate electrode is arranged together with an adhesive which has insulating properties. The bonding step is performed at a temperature lower than a melting point or a glass transition temperature of the first thermoplastic resin and lower than a melting point or a glass transition temperature of the second thermoplastic resin. The adhering step is performed at a temperature lower than the melting point or the glass transition temperature of the first thermoplastic resin and lower than the melting point or the glass transition temperature of the second thermoplastic resin.

According to the present disclosure, a connection structure can be provided in which each substrate is adhered and each substrate electrode arranged on each substrate is bonded, the connection structure being highly reliable with less connection failure among the respective substrate electrodes.

DETAILED DESCRIPTION

The connection structure of the present disclosure is described below.

However, the present disclosure is not limited to the following configurations and can be applied as changed as appropriate in a scope not changing the gist of the present disclosure. Note that one obtained by combining two or more of individual desirable configurations of the present disclosure described below is also the present disclosure.

It goes without saying that each embodiment described below is an example and partial replacement or combination of configurations described in different embodiments can be made. In Embodiment 2 onward, description about matters common to Embodiment 1 is omitted, and only different points are described. In particular, operations and effects similar to those by a similar configuration are not mentioned one by one for each embodiment.

The drawings described below are schematic, and their dimensions, aspect ratio scale, and so forth may be different from those of actual products.

Embodiment 1

Figure 1:
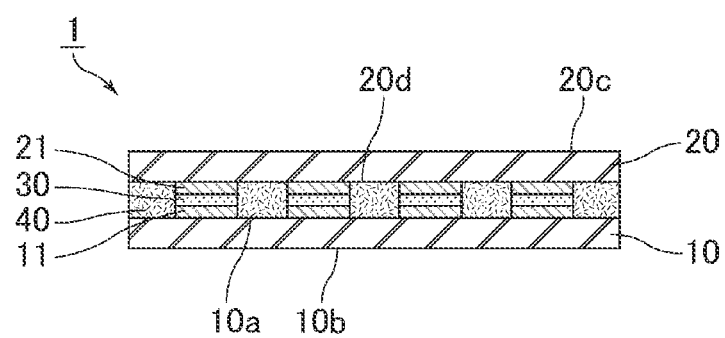
FIG. 1 is a sectional view schematically depicting one example of a connection structure of the present disclosure.

FIG. 1 is a sectional view schematically depicting one example of a connection structure of the present disclosure.

A connection structure 1 depicted in FIG. 1 includes a first substrate 10 which has a first principal surface 10a and a second principal surface 10b opposed to the first principal surface 10a and includes a first thermoplastic resin, and a second substrate 20 which has a third principal surface 20c and a fourth principal surface 20d opposed to the third principal surface 20c and facing the first principal surface 10a and includes a second thermoplastic resin. Also, the first principal surface 10a has a first substrate electrode 11 arranged thereon, and the fourth principal surface 20d has a second substrate electrode 21 arranged thereon.

And, the first substrate electrode 11 and the second substrate electrode 21 are bonded together with a conductive bonding material 30. Note that in the connection structure 1, the first substrate electrode 11 and the second substrate electrode 21 each have the same size and are bonded together so that both are superposed so as to coincide with each other when viewed from a thickness direction.

Furthermore, the first principal surface 10a other than a portion where the first substrate electrode 11 is arranged and the fourth principal surface 20d other than a portion where the second substrate electrode 21 is arranged are bonded together with an insulating adhesive 40.

Also, in the connection structure 1, the bonding temperature of the bonding material 30 is lower than the melting point or the glass transition temperature of the first thermoplastic resin and lower than the melting point or the glass transition temperature of the second thermoplastic resin. Also, in the connection structure 1, the adhesion temperature of the adhesive 40 is lower than the melting point or the glass transition temperature of the first thermoplastic resin and lower than the melting point or the glass transition temperature of the second thermoplastic resin.

To manufacture the connection structure 1, the bonding material 30 is arranged between the first substrate electrode 11 and the second substrate electrode 21, the adhesive 40 is arranged between the first principal surface 10a other than the portion where the first substrate electrode 11 is arranged and the fourth principal surface 20d other than the portion where the second substrate electrode 21 is arranged, and heat is applied to the first substrate 10 and the second substrate 20 to connect these.

In the connection structure 1, the bonding temperature of the bonding material 30 is lower than the melting point or the glass transition temperature of the first thermoplastic resin and lower than the melting point or the glass transition temperature of the second thermoplastic resin. Thus, the first substrate electrode 11 and the second substrate electrode 21 can be bonded together with the bonding material 30 at a temperature lower than the melting point or the glass transition temperature of the first thermoplastic resin and lower than the melting point or the glass transition temperature of the second thermoplastic resin. That is, the first substrate electrode 11 and the second substrate electrode 21 can be bonded together with the bonding material 30 before the first thermoplastic resin and the second thermoplastic resin are melted or softened. As a result, the first substrate electrode 11 and the second substrate electrode 21 each less tend to be shifted from the arrangement positions of the first substrate 10 and the second substrate 20 or to sink therein.

Also, in the connection structure 1, the adhesion temperature of the adhesive 40 is lower than the melting point or the glass transition temperature of the first thermoplastic resin and lower than the melting point or the glass transition temperature of the second thermoplastic resin. Thus, the first principal surface 10*a* and the fourth principal surface 20*d* can be adhered together with the adhesive 40 at a temperature lower than the melting point or the glass transition temperature of the first thermoplastic resin and lower than the melting point or the glass transition temperature of the second thermoplastic resin. That is, the first principal surface 10*a* and the fourth principal surface 20*d* can be adhered together before the first thermoplastic resin and the second thermoplastic resin are melted or softened. As a result, the first substrate electrode 11 and the second substrate electrode 21 each less tend to be shifted from the arrangement positions of the first substrate 10 and the second substrate 20 or to sink therein. That is, in the connection structure 1, the first substrate electrode 11 and the second substrate electrode 21 do not sink in the first substrate 10 and the second substrate 20, respectively, and maintain the same height as the surroundings.

Since the connection structure 1 has the above-described configuration, connection failure between the first substrate electrode 11 and the second substrate electrode 21 due to the first substrate electrode 11 and the second substrate electrode 21 shifting from the arrangement positions of the first substrate 10 and the second substrate 20, respectively, or sinking therein less tends to occur.

Each configuration of the connection structure 1 is described in detail below.

(First Substrate and Second Substrate)

The first substrate 10 may be any substrate that can have the first substrate electrode 11 arranged and includes the first thermoplastic resin, and is preferably a flexible substrate.

In the specification, the "first thermoplastic resin" means a resin having a property of being melted or softened by application of heat.

When the first thermoplastic resin is melted by application of heat, its melting point is preferably 150° C. or higher and 350° C. or lower, and more preferably 200° C. or higher and 350° C. or lower. Also, when the first thermoplastic resin is softened by application of heat, its glass transition temperature is preferably 100° C. or higher and 350° C. or lower, and more preferably 150° C. or higher and 350° C. or lower.

Note that in the specification, the melting point or the glass transition temperature of the first thermoplastic resin means a value measured pursuant to differential scanning calorimetry (DSC) in JIS K7121. Also, when the first thermoplastic resin includes a plurality of resins, "the melting point or the glass transition temperature of the first thermoplastic resin" means the melting point or the glass transition temperature of a resin with the largest ratio of mass included in the first thermoplastic resin. When there are a plurality of types of resin with the largest ratio of mass included in the first thermoplastic resin, "the melting point or the glass transition temperature of the first thermoplastic resin" means an average value of the melting points or the glass transition temperatures of these resins. When the first thermoplastic resin includes a plurality of resins, the ratio of mass and type of each resin can be measured by a method such as Fourier transform infrared spectroscopy (FT-IR), gas chromatography-mass spectrometry (GC-MS), or the like.

The first thermoplastic resin is not particularly restrictive, and may be, for example, a liquid-crystal polymer (melting point: on the order of 240° C. to 320° C.); fluorine-based resin such as polytetrafluoroethylene (PTFE) (melting point: on the order of 330° C.) or perfluoroalkoxyalkane (PFA) (melting point: on the order of 310° C.); polyimide (PI) (glass transition temperature: on the order of 250° C.); polyphenylene ether (PPE) (glass transition temperature: on the order of 200° C.); cycloolefin polymer (COP) (melting point: on the order of 230° C.); or the like. Since these resins have flexibility at ordinary temperatures, by using any of these resins, the first substrate can be easily made as a flexible substrate. Also, since these resins have low permittivity, in the first substrate 10 including any of these resins, transmission loss can be decreased.

The permittivity of the first thermoplastic resin is preferably 3.5 or smaller, and more preferably 2.0 or larger and 3.0 or smaller (i.e., from 2.0 to 3.0). Note that in the specification, permittivity means relative permittivity ($F_r$).

Note that the first thermoplastic resin included in the first substrate 10 may be of one type or two or more types.

The second substrate 20 may be any substrate that can have the second substrate electrode 21 arranged and includes the second thermoplastic resin, and is preferably a flexible substrate.

In the specification, the "second thermoplastic resin" means a resin having a property of being melted or softened by application of heat.

A preferable melting point or glass transition temperature, a preferable type, a preferable permittivity, and so forth of the second thermoplastic resin are the same as the above-described preferable melting point or glass transition temperature, preferable type, preferable permittivity, and so forth of the first thermoplastic resin. Note that the second thermoplastic resin included in the second substrate 20 may be of one type or two or more types.

In the connection structure 1, the first thermoplastic resin and the second thermoplastic resin may be resins of the same type or different types.

The first substrate 10 may include a silicon compound, nitrogen compound, or the like, other than the first thermoplastic resin. Also, the second substrate 20 may include a silicon compound, nitrogen compound, or the like, other than the second thermoplastic resin. The first substrate 10 and the second substrate 20 may have the same composition or different compositions.

In the connection structure 1, it is preferable that the first substrate 10 and the second substrate 20 each have the same size and the first substrate 10 and the second substrate 20 are laminated together so that the first principal surface 10*a* and the fourth principal surface 20*d* are superposed so as to coincide with each other when viewed from the thickness direction. However, in the connection structure of the present disclosure, the first substrate and the second substrate may be bonded together so as to be at least partially superposed each other when viewed from the thickness direction. Also, in the connection structure of the present disclosure, one substrate may be larger than the other substrate and the substrates may be bonded together so that one substrate is entirely or at least partially superposed on the other substrate when viewed from the thickness direction.

(First Substrate Electrode and Second Substrate Electrode)

The first substrate electrode 11 and the second substrate electrode 21 may be formed of any material and may have any shape that can be bonded together via the bonding material 30.

The first substrate electrode 11 and the second substrate electrode 21 may be preferably formed of a conductive member including metal such as Au, Ag, Cu, or the like. In the connection structure 1, the first substrate electrode 11 and the second substrate electrode 21 may be formed of the same material or different materials.

On a contact surface with the bonding material 30 between the first substrate electrode 11 and the second substrate electrode 21, a metal rust-inhibiting layer such as Zn/Cr or an organic rust-inhibiting layer by a silane coupling agent or the like may be formed. Also, on the contact surface, preflux treatment may be performed, or plating may be performed such as Ni plating, Ni/Au plating, Ni/Ag plating, or the like.

The first substrate electrode 11 and the second substrate electrode 21 is preferably pattern-formed by a method such as photolithography, printing, inkjet, plating, or the like.

Note that in the connection structure 1, the first substrate electrode 11 and the second substrate electrode 21 each have the same size and are bonded together so that both are superposed so as to coincide with each other when viewed from the thickness direction. However, in the connection structure of the present disclosure, the first substrate electrode and the second substrate electrode may be bonded together so as to be at least partially superposed each other when viewed from the thickness direction. Also, in the connection structure of the present disclosure, one substrate electrode may be larger than the other substrate electrode and the substrate electrodes may be bonded together so that one substrate electrode is entirely or at least partially superposed on the other substrate electrode when viewed from the thickness direction.

(Bonding Material)

The bonding material 30 is not particularly restrictive as long as it is conductive and can bond the first substrate electrode 11 and the second substrate electrode 21 together at the bonding temperature, and may be, for example, a sintered body of conductive paste including metal nanoparticles, lead-free solder, a conductive adhesive including conductive particles and a thermoplastic resin, or the like.

Note that in the specification, the "bonding temperature of the bonding material" means a temperature at which a change in properties of the bonding material 30 occurs such as softening, curing, or the like to allow the first substrate electrode 11 and the second substrate electrode 21 to be bonded together.

When the bonding material 30 is a sintered body of conductive paste including metal nanoparticles, the "bonding temperature of the bonding material" means the sintering temperature of the metal nanoparticles. The sintering temperature of the metal nanoparticles is preferably 150° C. or lower, and more preferably 100° C. or higher and 150° C. or lower.

The metal nanoparticles are not particularly restrictive and, for example, Ag nanoparticles, Au nanoparticles, Cu nanoparticles, Ni nanoparticles, and so forth can be recited.

When the bonding material 30 is lead-free solder, the "bonding temperature of the bonding material" means the melting point of the lead-free solder. The melting point of the lead-free solder is preferably 150° C. or lower, and more preferably 140° C. or lower. Also, the melting point of the lead-free solder is preferably 100° C. or higher.

The lead-free solder is not particularly restrictive, lead-free solder made of two or more types of conductive metal is preferable, and Sn—Bi—Sb—Ni-based lead-free solder (melting point: 140° C.), Sn—Bi-based lead-free solder (melting point: 139° C.), or the like is more preferable.

When the bonding material 30 is a conductive adhesive including conductive particles and a thermoplastic resin, the "bonding temperature of the bonding material" means the thermosetting temperature of the thermoplastic resin. The thermosetting temperature of the thermoplastic resin is preferably 150° C. or lower, and more preferably 100° C. or higher and 150° C. or lower.

As the conductive particles, metal particles such as Cu particles and Ag particles, non-metal particles such as carbon particles, and so forth can be recited. As the thermoplastic resin, an epoxy resin (thermosetting temperature: 80° C. to 150° C.), a silicone resin (thermosetting temperature: 100° C. to 150° C.), and so forth can be recited.

The thickness of the bonding material 30 is not particularly restrictive, and is preferably 5 μm or longer and 50 μm or shorter (i.e., from 5 μm to 50 m).

(Adhesive)

The adhesive 40 has its composition not particularly restrictive as long as it has insulating properties and can adhere the first principal surface 10a and the fourth principal surface 20d together at an adhesion temperature. For example, the adhesive 40 may be an adhesive including a polyolefin resin, or the like. As the polyolefin resin, a polyolefin resin with polymerized alkene having a carbon number 2 or larger and 4 or smaller (i.e., from 2 to 4), such as ethylene or propylene, is preferable. Also, the polyolefin resin may be an acid-denatured polyolefin resin acid-denatured with an unsaturated carboxylic acid component. As the unsaturated carboxylic acid component, acrylic acid, methacrylic acid, or the like is preferable and, among others, methacrylic acid is more preferable. The adhesive 40 may include one type of polyolefin resin, or may include two or more types thereof.

Note that the adhesive 40 functions as part of a resist. Thus, the adhesive 40 also plays a role of preventing a short circuit among the respective substrate electrodes.

The adhesive 40 may include a urethane resin, a melamine resin, or the like, other than the polyolefin resin.

The ratio of the polyolefin resin included in the adhesive 40 is preferably 50 weight percent or larger and 95 weight percent or less (i.e., from 50 weight percent to 95 weight percent).

Also, the adhesive 40 may be made of an underfill material such as an epoxy resin.

Note that in the specification, the "adhesion temperature of the adhesive" means a temperature at which a change in properties of the adhesive 40 occurs such as softening, curing, or the like to allow the first principal surface 10a and the fourth principal surface 20d to be adhered together. For example, when the adhesive 40 is an adhesive including a polyolefin resin, the "adhesion temperature of the adhesive" means the melting point or the glass transition temperature of the polyolefin resin. The melting point or the glass transition temperature of the resin is preferably 150° C. or lower, and more preferably 80° C. or higher and 150° C. or lower (i.e., from 80° C. to 150° C.). Note that the melting point or the glass transition temperature of the resin means a value measured pursuant to differential scanning calorimetry (DSC) in JIS K7121. When the adhesive 40 includes a plurality of resins, the "adhesion temperature of the adhesive" means the melting point or the glass transition temperature of a resin with the largest ratio of mass included in the adhesive 40. When there are a plurality of types of resin with the largest ratio of mass included in the adhesive 40, the "adhesion temperature of the adhesive" means an average value of the melting points or the glass transition temperatures of these resins. When the adhesive 40 includes a plurality of resins, the ratio of mass and type of each resin can be measured by a method such as FT-IR, GC-MS, or the like.

By using this adhesive 40, adhesion strength between the first substrate 10 and the second substrate 20 can be improved.

The thickness of the adhesive 40 is not particularly restrictive, and is preferably 30 µm or longer and 80 µm or shorter (i.e., from 30 µm to 80 µm).

In the connection structure 1, the permittivity of the adhesive 40 is preferably lower than the permittivity of the first thermoplastic resin and the permittivity of the second thermoplastic resin. Also, the permittivity of the adhesive 40 is preferably 3.5 or smaller, and more preferably 2.0 or larger and 3.0 or smaller (i.e., from 2.0 to 3.0). When the first principal surface 10a and the fourth principal surface 20d are adhered together by using the adhesive 40 having this low permittivity, transmission loss in the entire connection structure 1 can be decreased.

In the connection structure 1, the percentage of water absorption of the adhesive 40 is preferably 1% or lower, and more preferably 0.1% or lower. When the first principal surface 10a and the fourth principal surface 20d are adhered together by using the adhesive 40 with this low percentage of water absorption, the adhesive 40 less tends to absorb moisture in the air. Thus, it is possible to suppress degradation in reliability in the entire connection structure 1 due to moisture absorption.

In the connection structure 1, the structure and components of the adhesive 40 can be determined by using Fourier transform infrared spectroscopy (FT-IR) and a gas chromatography-mass spectrometer (GC-MS).

In the connection structure 1, a ratio between the coefficient of linear expansion of the first thermoplastic resin and the coefficient of linear expansion of the first substrate electrode is preferably the coefficient of linear expansion of the first thermoplastic resin/the coefficient of linear expansion of the first substrate electrode=0.8 or larger and 1.2 or smaller (i.e., from 0.8 to 1.2). Also, a ratio between the coefficient of linear expansion of the second thermoplastic resin and the coefficient of linear expansion of the second substrate electrode is preferably the coefficient of linear expansion of the second thermoplastic resin/the coefficient of linear expansion of the second substrate electrode=0.8 or larger and 1.2 or smaller (i.e., from 0.8 to 1.2). In this manner, when the ratio between the coefficient of linear expansion of the thermoplastic resin and the coefficient of linear expansion of the substrate electrode is close to 1.0, when the first substrate and the second substrate are heated, the substrate electrode less tends to be shifted by thermal expansion. As a result, connection failure between the first substrate electrode 11 and the second substrate electrode 21 less tends to occur.

In the connection structure 1, a combination of preferable materials of the first thermoplastic resin and the second thermoplastic resin, the first substrate electrode and the second substrate electrode, the bonding material, and the adhesive is as follows.

First thermoplastic resin and second thermoplastic resin: liquid-crystal polymer (product name: MetroCirc; manufacturer: Murata Manufacturing Co., Ltd.) or polyimide First substrate electrode and second substrate electrode: Cu Bonding material: Sn—Bi based lead-free solder Adhesive: polyolefin resin obtained by acid-denaturing an ethylene-propylene copolymer with methacrylic acid Note that in the specification, the coefficient of linear expansion is a coefficient of linear expansion in a plane direction measured by the thermomechanical analysis (TMA method) pursuant to JIS C6481.

When the permittivity of the adhesive 40 is within the above-described range, the connection structure 1 is used preferably in an electronic device which transmits a signal with frequencies of 4G frequencies (3.5 GHz band), and more preferably in an electronic device which transmits a signal with frequencies of 5G frequencies (sub6 (3.7 GHz, 4.5 GHz bands)) and milli-waves (28 GHz band). In general, transmission loss tends to occur when a high-frequency signal is transmitted. However, in the connection structure 1 having the adhesive 40 with its permittivity being within the above-described range, transmission loss less tends to occur. Thus, even if the connection structure 1 is used for an electronic device which transmits a signal with the above-described frequencies, transmission characteristics are favorable.

Figure 2:
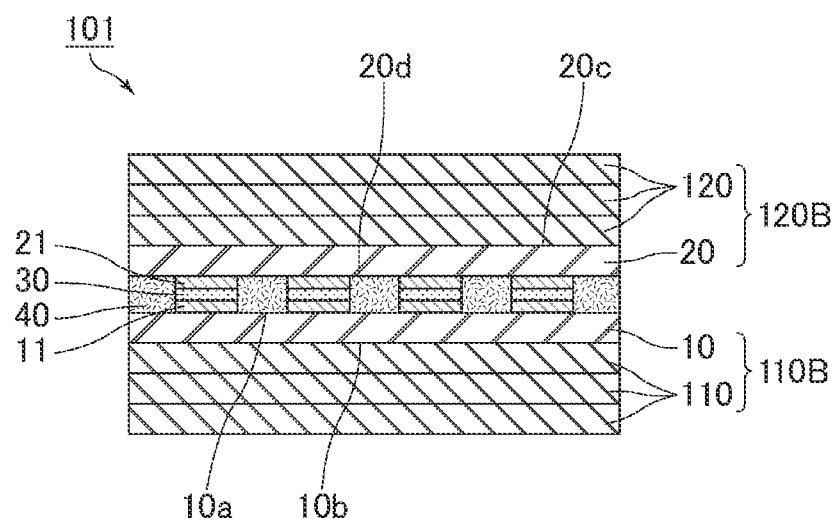
FIG. 2 is a sectional view schematically depicting one example of another aspect of the connection structure of the present disclosure.

Next, another aspect of the connection structure of the present disclosure is described. FIG. 2 is a sectional view schematically depicting one example of another aspect of the connection structure of the present disclosure. In a connection structure 101 depicted in FIG. 2, a first substrate block 110B with a plurality of substrates 110 including the first substrate 10 laminated and a second substrate block 120B with a plurality of substrates 120 including the second substrate 20 laminated are connected together. The connection structure 101 has the same configuration as that of the above-described connection structure 1 except that the plurality of substrates 110 are laminated on a second principal surface 10b side of the first substrate 10 and the plurality of substrates 120 are laminated on a third principal surface 20c side of the second substrate 20.

When a conventional substrate block is multilayered, a substrate configuring a substrate block includes a thermoplastic resin, and when substrate blocks are connected together at a temperature exceeding the melting point or the glass transition temperature of the thermoplastic resin, the thermoplastic resin is melted or softened, and there is a possibility that connection failure due to a wiring shift of any substrate electrode or inside any substrate block, or the like.

However, when the connection structure 101 is manufactured, the first substrate 10 and the second substrate 20 are connected together, with the first substrate 10 arranged on the outermost portion of the first substrate block 110B and the second substrate 20 arranged on the outermost portion of the second substrate block 120B. Here, before the first thermoplastic resin and the second thermoplastic resin are melted or softened, the first substrate electrode 11 and the second substrate electrode 21 can be bonded together with the bonding material 30 and the first principal surface 10a and the fourth principal surface 20d can be adhered together with the adhesive 40. Thus, in the manufactured connection structure 101, connection failure due to wiring shift of not only the first substrate electrode 11 and the second substrate electrode 21 but also the first substrate block 110B and the second substrate block 120B, or the like less tends to occur.

Furthermore, since the first substrate block 110B and the second substrate block 120B are connected together, compared with a case in which the substrate 110, the first substrate 10, the second substrate 20, and the substrate 120 are connected one by one, shifts of the substrate electrodes, wiring positions, and so forth in the entire connection structure 101 can be suppressed. Also, with connection in substrate block units, the yield rate can be increased.

The substrate 110 included in the first substrate block 110B may be a flexible substrate or rigid substrate. For these substrates, any general substrate for use in this field can be used. Similarly, the substrate 120 included in the second substrate block 120B may be a flexible substrate or rigid substrate. For these substrates, any general substrate for use in this field can be used. Also, the first substrate block 110B and the second substrate block 120B each may be a composite substrate with a flexible substrate and a ridge substrate both laminated.

Note that the connection between the first substrate block 110B and the second substrate block 120B can be made by the same method as the method of connecting the first substrate 10 and the second substrate 20 together in the above-described connection structure 1.

Figure 3:
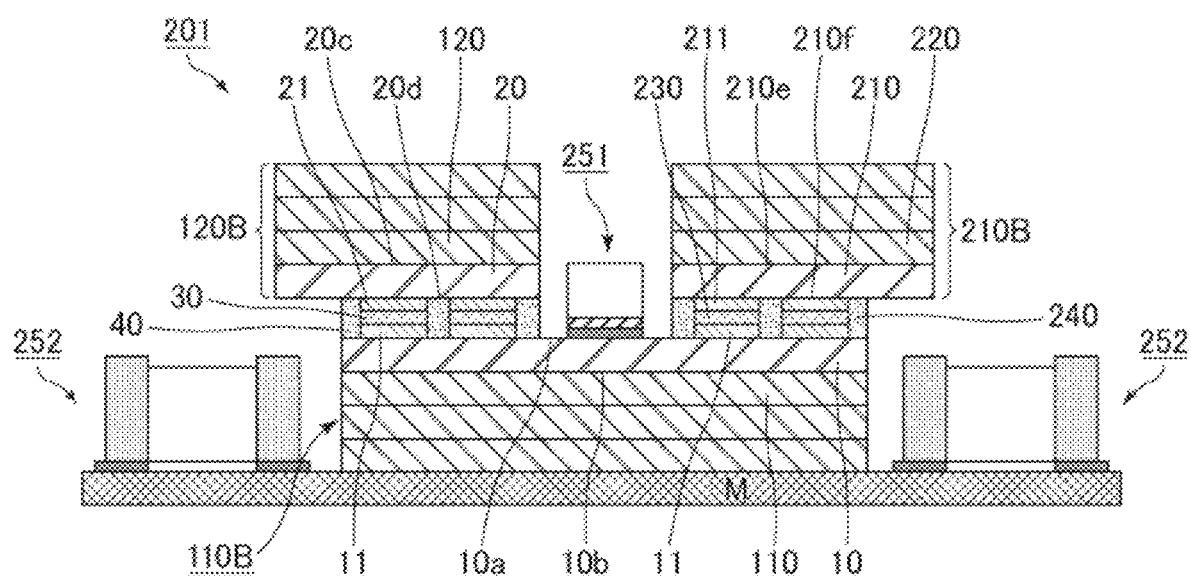
FIG. 3 is a sectional view schematically depicting one example of another aspect of the connection structure of the present disclosure.

Next, another aspect of the connection structure of the present disclosure is described. FIG. 3 is a sectional view schematically depicting one example of another aspect of the connection structure of the present disclosure. In a connection structure 201 depicted in FIG. 3, the first substrate block 110B is arranged on a motherboard M, and the first substrate 10 is arranged on an outermost portion of the first substrate block 110B on a side not in contact with the motherboard M. Also, the second substrate block 120B is connected to part of the first principal surface 10a of the first substrate 10. To another part thereof, a third substrate block 210B formed of a third substrate 210 as a connection substrate to the first substrate block 110B and a plurality of substrates 220 laminated on the third substrate 210 is connected.

In the connection structure 201, an onboard component 251 is arranged at a location on the first principal surface 10a of the first substrate 10 where the second substrate block 120B and the third substrate block 210B are not adhered. Also, a mounted component 252 is arranged at a location on the motherboard M where the first substrate block 110B is not arranged.

The first substrate block 110B and the second substrate block 120B are connected together by a structure identical to the above-described connection structure 101.

Therefore, when the connection structure 201 is manufactured, the first substrate block 110B and the second substrate block 120B are connected together. The connection between the first substrate block 110B and the second substrate block 120B can be made by the same method as the method of connecting the first substrate 10 and the second substrate 20 together in the above-described connection structure 1.

Next, the connection between the first substrate block 110B and the third substrate block 210B is described. On the third substrate block 210B, the third substrate 210 as a connection substrate to the first substrate block 110B is arranged. The third substrate 210 has a fifth principal surface 210e and a sixth principal surface 210f opposed to the fifth principal surface 210e and facing the first principal surface 10a. Furthermore, on the sixth principal surface 210f, a third substrate electrode 211 is arranged. The third substrate electrode 211 is bonded to the first substrate electrode 11 arranged on the first substrate 10 with a conductive bonding material 230. Also, the sixth principal surface 210f other than a portion where the third substrate electrode 211 is arranged and the first principal surface 10a other than a portion where the first substrate electrode 11 is arranged are adhered together with an insulating adhesive 240. Also, the third substrate 210 includes a third thermoplastic resin.

The bonding temperature of the bonding material 230 is lower than the melting point or the glass transition temperature of the first thermoplastic resin and lower than the melting point or the glass transition temperature of the third thermoplastic resin, and the adhesion temperature of the adhesive 240 is lower than the melting point or the glass transition temperature of the first thermoplastic resin and lower than the melting point or the glass transition temperature of the third thermoplastic resin.

When the connection structure 201 is manufactured, the bonding material 230 is arranged between the first substrate electrode 11 and the third substrate electrode 211, the adhesive 240 is arranged between the first principal surface 10a other than the portion where the first substrate electrode 11 is arranged and the sixth principal surface 210f other than the portion where the third substrate electrode 211 is arranged, and heat is applied to the first substrate 10 and the third substrate 210 to connect these.

In the connection structure 201, the bonding temperature of the bonding material 230 is lower than the melting point or the glass transition temperature of the first thermoplastic resin and lower than the melting point or the glass transition temperature of the third thermoplastic resin. Thus, the first substrate electrode 11 and the third substrate electrode 211 can be bonded together with the bonding material 230 at a temperature lower than the melting point or the glass transition temperature of the first thermoplastic resin and lower than the melting point or the glass transition temperature of the third thermoplastic resin. That is, the first substrate electrode 11 and the third substrate electrode 211 can be bonded together with the bonding material 230 before the first thermoplastic resin and the third thermoplastic resin are melted or softened. As a result, the first substrate electrode 11 and the third substrate electrode 211 each less tend to be shifted from the arrangement positions of the first substrate 10 and the third substrate 210 or to sink therein.

Also, in the connection structure 201, the adhesion temperature of the adhesive 240 is lower than the melting point or the glass transition temperature of the first thermoplastic resin and lower than the melting point or the glass transition temperature of the third thermoplastic resin. Thus, the first principal surface 10a and the sixth principal surface 210f can be adhered together with the adhesive 240 at a temperature lower than the melting point or the glass transition temperature of the first thermoplastic resin and lower than the melting point or the glass transition temperature of the third thermoplastic resin. That is, before the first principal surface 10a and the sixth principal surface 210f can be adhered together before the first thermoplastic resin and the third thermoplastic resin are melted or softened. As a result, the first substrate electrode 11 and the third substrate electrode 211 each less tend to be shifted from the arrangement positions of the first substrate 10 and the third substrate 210 or to sink therein.

Since the connection structure 201 has the above-described configuration, connection failure between the first substrate electrode 11 and the third substrate electrode 211 less tends to occur.

Preferable aspects of the third substrate 210, the third substrate electrode 211, and the third thermoplastic resin are identical to the above-described preferable aspects of the first substrate 10, the first substrate electrode 11, and the first thermoplastic resin. Also, the substrate 220 may be a flexible substrate or rigid substrate. Also, the third substrate block 210B may be a composite substrate with a flexible substrate and a ridge substrate both laminated.

Preferable aspects of the bonding material 230 and the adhesive 240 are identical to the above-described preferable aspects of the bonding material 30 and the adhesive 40.

When the connection structure 201 is manufactured, the connection between the first substrate block 110B and the second substrate block 120B and the connection between the first substrate block 110B and the third substrate block 210B may be simultaneously performed. Also, the second substrate block 120B and the third substrate block 210B may be connected in separate periods.

The motherboard M, the onboard component 251, and the mounted component 252 are not particularly restrictive, and any normal component for use in this field or the like can be used.

In the above-described connection structure 201, the third substrate block 210B includes the third substrate 210. However, the third substrate block 210B does not have to include the third substrate 210 as long as the first substrate block 110 and the third substrate block 210B are connected together. Also, the first substrate block 110B and the third substrate block 210B may be connected together with a normal bonding material and a normal adhesive for use in this field.

As in the connection structure 201 depicted in FIG. 3, by connecting the first block 110B and the second substrate block 120B and the third substrate block 210B together so as not to cover the entire surface of the first principal surface 10a of the first substrate 10 in the first substrate block 110B, a cavity portion can be formed in the first principal surface 10a of the first substrate 10. Since the connection structure 201 has this cavity portion, it is possible to arrange the onboard component 251 in the cavity portion. Also, by providing another space for arranging the mounted component 252 on a collective board, interruption of wiring by the mounted component 252 can be avoided. Thus, complex wire routing can be made.

Embodiment 2

Next, a connection structure manufacturing method of the present disclosure is described. The connection structure manufacturing method of the present disclosure includes: a first substrate preparing step of preparing a first substrate which has a first principal surface and a second principal surface opposed to the first principal surface, includes a first substrate electrode on the first principal surface, and includes a first thermoplastic resin; a second substrate preparing step of preparing a second substrate which has a third principal surface and a fourth principal surface opposed to the third principal surface, includes a second substrate electrode on the fourth principal surface, and includes a second thermoplastic resin; a bonding step of bonding the first substrate electrode and the second substrate electrode together with a conductive bonding material; and an adhering step of adhering the first principal surface other than a portion where the first substrate electrode is arranged and the fourth principal surface other than a portion where the second substrate electrode is arranged together with an insulating adhesive. The bonding step is performed at a temperature lower than the melting point or the glass transition temperature of the first thermoplastic resin and lower than the melting point or the glass transition temperature of the second thermoplastic resin, and the adhering step is performed at a temperature lower than the melting point or the glass transition temperature of the first thermoplastic resin and lower than the melting point or the glass transition temperature of the second thermoplastic resin. Any other step and so forth may be included as long as the above-described connection structure of the present disclosure can be manufactured.

The connection structure manufacturing method of the present disclosure is described as three patterns (Process 1 to Process 3) below.

[Process 1]

The connection structure manufacturing method of the present disclosure according to Process 1 includes a first substrate preparing step, a second substrate preparing step, a resist forming step, a surface treatment step, an adhesive supplying step, a resist removing step, a bonding material supplying step, a bonding step, and an adhering step. Each step is described below.

(First Substrate Preparing Step and Second Substrate Preparing Step)

Figure 4:
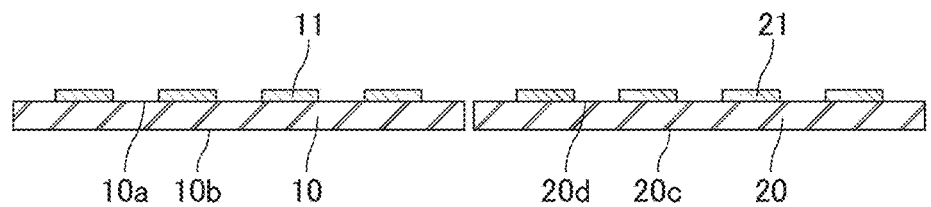
FIG. 4 is a sectional view schematically depicting one example of a first substrate preparing step and a second substrate preparing step in a connection structure manufacturing method of the present disclosure.

FIG. 4 is a sectional view schematically depicting one example of the first substrate preparing step and the second substrate preparing step in the connection structure manufacturing method of the present disclosure. As depicted in FIG. 4, in the first substrate preparing step, the first substrate 10 is prepared, which has the first principal surface 10a and the second principal surface 10b opposed to the first principal surface 10a, includes the first substrate electrode 11 on the first principal surface 10a, and includes the first thermoplastic resin. Similarly, in the second substrate preparing step, the second substrate 20 is prepared, which has the third principal surface 20c and the fourth principal surface 20d opposed to the third principal surface 20c, includes the second substrate electrode 21 on the fourth principal surface 20d, and includes the second thermoplastic resin. Since preferable aspects of the first substrate 10, the first thermoplastic resin, and the first substrate electrode 11 and preferable aspects of the second substrate 20, the second thermoplastic resin, and the second substrate electrode 21 have been already described, description is omitted herein.

(Resist Forming Step)

Figure 5:
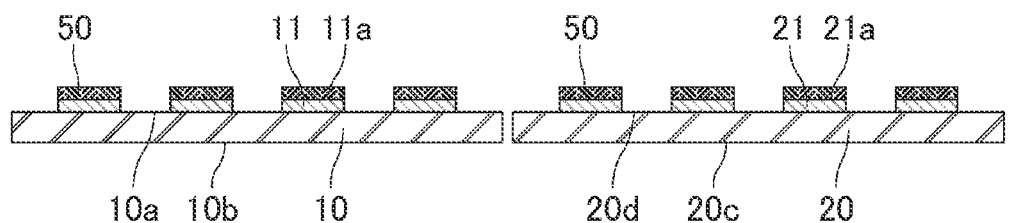
FIG. 5 is a sectional view schematically depicting one example of a resist forming step in the connection structure manufacturing method of the present disclosure.

FIG. 5 is a sectional view schematically depicting one example of the resist forming step in the connection structure manufacturing method of the present disclosure. Next, as depicted in FIG. 5, a resist 50 is formed on a front surface 11a of the first substrate electrode 11 and a front surface 21a of the second substrate electrode 21. The resist 50 may be made of any material that can protect the first substrate electrode 11 and the second substrate electrode 21 in the surface treatment step described below.

(Surface Treatment Step)

Figure 6:
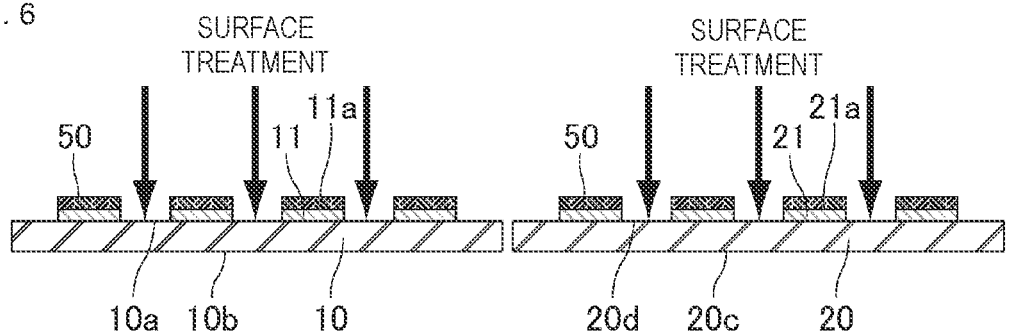
FIG. 6 is a sectional view schematically depicting one example of a surface treatment step in the connection structure manufacturing method of the present disclosure.

FIG. 6 is a sectional view schematically depicting one example of the surface treatment step in the connection structure manufacturing method of the present disclosure. Next, as depicted in FIG. 6, surface treatment is performed on the first principal surface 10a of the first substrate 10 and the fourth principal surface 20d of the second substrate 20. As surface treatment, surface modification treatment can be recited, for example, plasma treatment, UV treatment, flame treatment, and so forth. By performing surface modification treatment, adhesiveness between the first substrate 10 and the adhesive 40 and adhesiveness between the second substrate 20 and the adhesive 40 can be improved.

While plasma treatment is not particularly restrictive, a method of using vacuum plasma or atmospheric-pressure plasma using, for example, oxygen gas, nitrogen gas, or argon gas, can be recited.

While UV treatment is not particularly restrictive, a method of using, for example, a noble-gas excimer lamp, noble-gas halogen excimer lamp, or low-pressure mercury lamp, can be recited.

While flame treatment is not particularly restrictive, a method of using, for example, only flame or flam mixed with an organic compound or inorganic compound, can be recited.

(Adhesive Supplying Step)

Figure 7A:
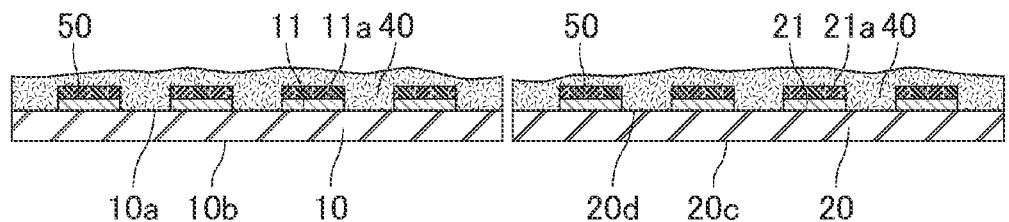
FIG. 7A is a sectional view schematically depicting one example of an adhesive supplying step in the connection structure manufacturing method of the present disclosure.
Figure 7B:
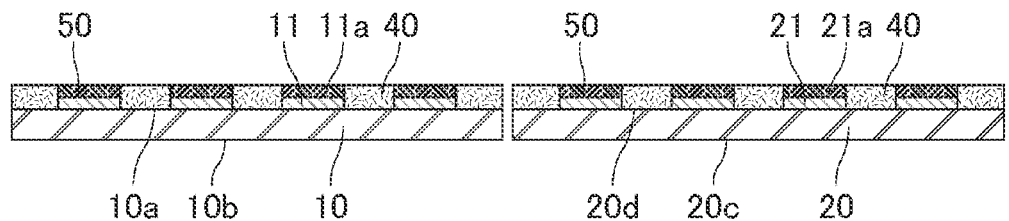
FIG. 7B is a sectional view schematically depicting on example of the adhesive supplying step in the connection structure manufacturing method of the present disclosure.

FIG. 7A and FIG. 7B are sectional views schematically depicting one example of the adhesive supplying step in the connection structure manufacturing method of the present disclosure. Next, as depicted in FIG. 7A, the adhesive 40 is supplied to the first principal surface 10a and the fourth principal surface 20d. As a supplying method, a method of supplying the adhesive 40 by a printing method, dispense method, or the like can be recited. Then, as depicted in FIG. 7B, the adhesive 40 is coated by a spin-coating method, bar-coating method, or the like, and drying is performed. As conditions for drying, conditions 100° C. or higher and 150° C. or lower (i.e., from 100° C. to 150° C.) and 30 seconds or longer and 60 seconds or shorter (i.e., from 30 seconds to 60 seconds) are preferable.

(Resist Removing Step)

Figure 8:
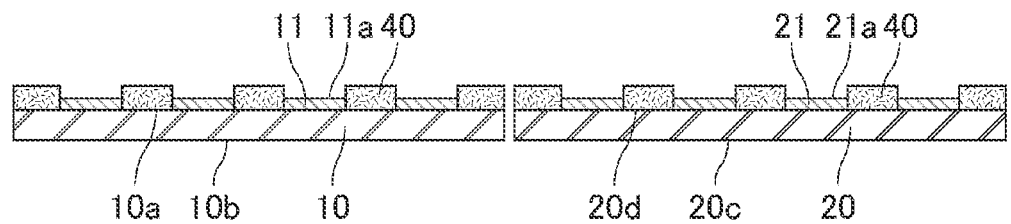
FIG. 8 is a sectional view schematically depicting one example of a resist removing step in the connection structure manufacturing method of the present disclosure.

FIG. 8 is a sectional view schematically depicting one example of the resist removing step in the connection structure manufacturing method of the present disclosure. Next, as depicted in FIG. 8, the resist 50 is removed to expose the first substrate electrode 11 and the second substrate electrode 21. A method of removing the resist 50 is preferably set as appropriate in accordance with the type of the resist 50.

(Bonding Material Supplying Step)

Figure 9:
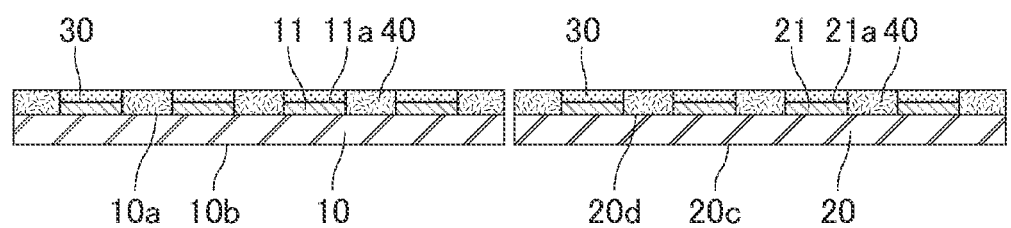
FIG. 9 is a sectional view schematically depicting one example of a bonding material supplying step in the connection structure manufacturing method of the present disclosure.

FIG. 9 is a sectional view schematically depicting one example of the bonding material supplying step in the connection structure manufacturing method of the present disclosure. Next, as depicted in FIG. 9, the bonding material 30 is supplied to the front surface 11a of the first substrate electrode 11 and the front surface 21a of the second substrate electrode 21. As a supplying method, a method of supplying the bonding material 30 by a printing method, dispense method, plating method, or the like can be recited. As the bonding material 30, lead-free solder, a conductive adhesive including conductive particles and a thermoplastic resin, or the like described in the above-described connection structure according to Embodiment 1 of the present disclosure can be used. Also, a conductive paste including metal nanoparticles before sintering can also be used.

(Bonding Step and Adhering Step)

Figure 10A:
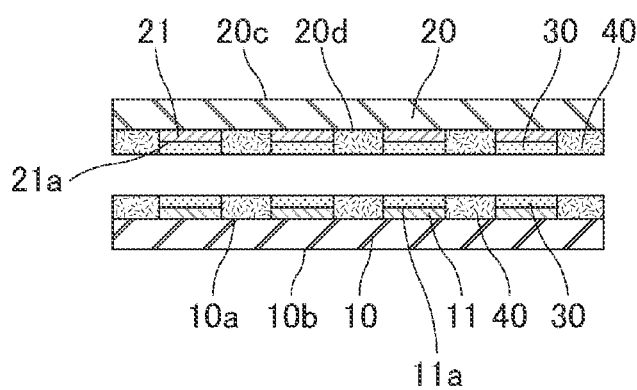
FIG. 10A is a sectional view schematically depicting one example of a bonding step and an adhering step in the connection structure manufacturing method of the present disclosure.
Figure 10B:
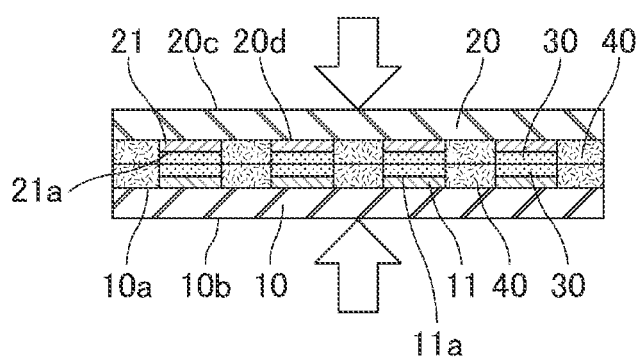
FIG. 10B is a sectional view schematically depicting one example of the bonding step and the adhering step in the connection structure manufacturing method of the present disclosure.

FIG. 10A and FIG. 10B are sectional views schematically depicting one example of the bonding step and the adhering step in the connection structure manufacturing method of the present disclosure. Next, the second substrate 20 is reversely rotated by 180 degrees as depicted in FIG. 10A, and the second substrate 20 is laminated on the first substrate 10 so that the first principal surface 10a and the fourth principal surface 20d face each other to fabricate a multilayer body. Here, the bonding material 30 arranged on the first substrate electrode 11 and the bonding material 30 arranged on the second substrate electrode 21 are set to make contact together.

Then, as depicted in FIG. 10B, heating and pressurization are performed from above and below the first substrate 10 and the second substrate 20 to bond the first substrate electrode 11 and the second substrate electrode 21 together with the bonding material 30 and adhere the first principal surface 10a and the fourth principal surface 20d together with the adhesive 40.

In this case, the bonding step and the adhering step are simultaneously performed, after all.

When the bonding step and the adhering step are simultaneously performed, heating and pressurization history can be decreased. Thus, it is possible to decrease damages of each substrate and inner components by heating and pressurization.

Conditions for heating and pressurization are not particularly restrictive as long as they are performed at a temperature lower than the melting point or the glass transition temperature of the first thermoplastic resin and lower than the melting point or the glass transition temperature of the second thermoplastic resin and, furthermore, equal to or higher than the bonding temperature of the bonding material 30 and equal to or higher than the adhesion temperature of the adhesive 40. However, the following conditions are preferable.

The temperature for heating is preferably 100° C. or higher and 150° C. or lower (i.e., from 100° C. to 150° C.), and more preferably 120° C. or higher and 150° C. or lower (i.e., from 120° C. to 150° C.). The pressure for pressurization is preferably 0.1 MPa or larger and 5.0 MPa or smaller (i.e., from 0.1 MPa to 5.0 MPa), and more preferably 0.1 MPa or larger and 1.0 MPa or smaller (i.e., from 0.1 MPa to 1.0 MPa). The time for heating and pressurization is preferably 10 seconds or longer and 1800 seconds or shorter (i.e., from 10 seconds to 1800 seconds), and more preferably 60 seconds or longer and 1800 seconds or shorter (i.e., from 60 seconds to 1800 seconds).

In particular, when the bonding material 30 is a conductive paste including metal nanoparticles, the temperature for heating is preferably 80° C. or higher and 150° C. or lower (i.e., from 80° C. to 150° C.), and more preferably 100° C. or higher and 150° C. or lower (i.e., from 100° C. to 150° C.). Also, when the bonding material 30 is lead-free solder, the temperature for heating is preferably 100° C. or higher and 150° C. or lower (i.e., from 100° C. to 150° C.), and more preferably 130° C. or higher and 150° C. or lower (i.e., from 130° C. to 150° C.). Also, when the bonding material 30 is a conductive adhesive including conductive particles and thermoplastic resin, the temperature for heating is preferably 100° C. or higher and 150° C. or lower (i.e., from 100° C. to 150° C.), and more preferably 120° C. or higher and 150° C. or lower (i.e., from 120° C. to 150° C.).

Also, when the adhesive 40 is an adhesive including polyolefin resin, the temperature for heating is preferably 80° C. or higher and 150° C. or lower (i.e., from 80° C. to 150° C.), and more preferably 100° C. or higher and 150° C. or lower (i.e., from 100° C. to 150° C.).

Via the above-described steps, the connection structure 1 depicted in FIG. 1 can be manufactured.

Note that in the above-described connection structure manufacturing method of the present disclosure according to Process 1, the bonding material 30 and the adhesive 40 are supplied to both of the first substrate 10 and the second substrate 20, but the bonding material and the adhesive may be supplied to only either one of the substrates in the connection structure manufacturing method of the present disclosure.

Also, in the above-described connection structure manufacturing method of the present disclosure according to Process 1, after the bonding material 30 and the adhesive 40 are supplied to each substrate, the bonding step and the adhesive step are simultaneously performed. However, in the connection structure manufacturing method of the present disclosure, after the first substrate electrode and the second substrate electrode are bonded together with the bonding material, the adhesive may be supplied between the first substrate and the second substrate to adhere the first principal surface and the fourth principal surface together with the adhesive. That is, the bonding step and the adhering step may be separately performed.

[Process 2]

The connection structure manufacturing method of the present disclosure according to Process 2 is identical to the above-described connection structure manufacturing method according to Process 1 except that a water-repellent coat forming step below is performed in place of the resist forming step and a water-repellent coat removing step is performed in place of the resist removing step. The water-repellent coat forming step and the water-repellent coat removing step are described below.

(Water-Repellent Coat Forming Step)

Figure 11:
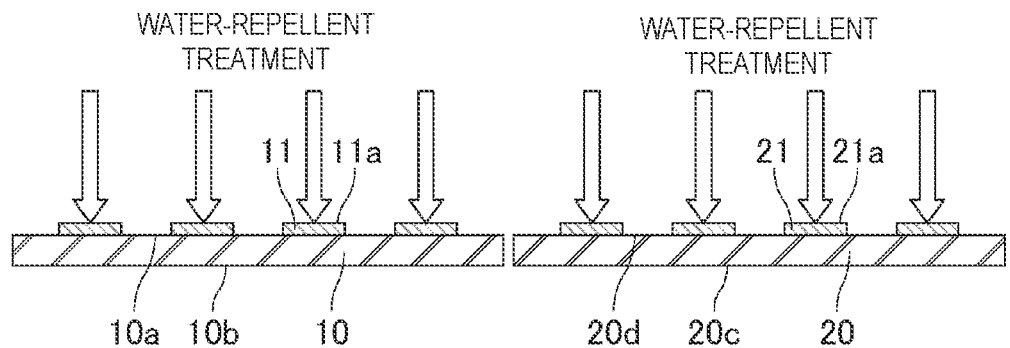
FIG. 11 is a sectional view schematically depicting one example of a water-repellent coat forming step in the connection structure manufacturing method of the present disclosure.

FIG. 11 is a sectional view schematically depicting one example of the water-repellent coat forming step in the connection structure manufacturing method of the present disclosure. In the water-repellent coat forming step, water-repellent treatment is performed on the front surface 11a of the first substrate electrode 11 and the front surface 21a of the second substrate electrode 21 to form a water-repellent coat. As the water-repellent coat, for example, a silane-coupling-based water-repellent treatment agent, a coat such as preflux or the like can be recited. By forming a water-repellent coat on the front surface 11a of the first substrate electrode 11 and the front surface 21a of the second substrate electrode 21, a decrease in insulation resistance among the substrate electrodes due to influences of atmospheric moisture, impurities, and so forth can be prevented.

(Water-Repellent Coat Removing Step)

After the adhesive supplying step is performed, the water-repellent coat is removed to expose the front surface 11a of the first substrate electrode 11 and the front surface 21a of the second substrate electrode 21 (not depicted in the drawings). A method of removing the water-repellent coat is preferably set as appropriate in accordance with the type of the water-repellent coat.

[Process 3]

The connection structure manufacturing method of the present disclosure according to Process 3 is identical to the above-described connection structure manufacturing method of the present disclosure according to Process 1 except that the resist forming step, the surface treatment step, the adhesive supplying step, and the resist removing step are replaced by an adhesive supplying step and a laser processing step below. The adhesive supplying step and the laser processing step are described below.

(Adhesive Supplying Step)

Figure 12A:
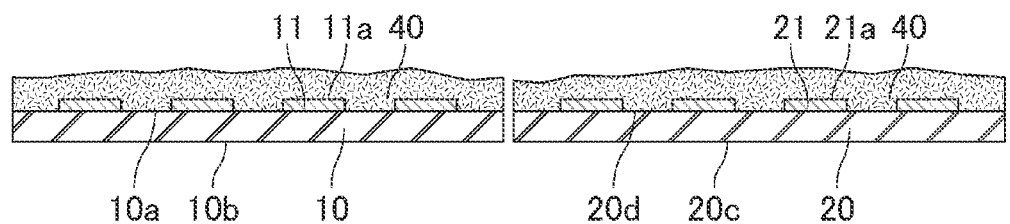
FIG. 12A is a sectional view schematically depicting one example of an adhesive supplying step in the connection structure manufacturing method of the present disclosure.
Figure 12B:
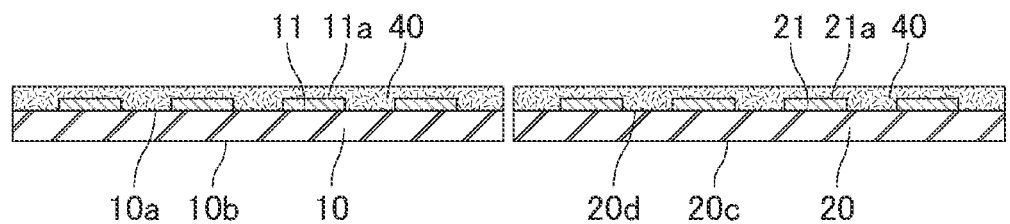
FIG. 12B is a sectional view schematically depicting one example of the adhesive supplying step in the connection structure manufacturing method of the present disclosure.

FIG. 12A and FIG. 12B are sectional views schematically depicting one example of the adhesive supplying step in the connection structure manufacturing method of the present disclosure. After the first substrate preparing step and the second substrate preparing step, as depicted in FIG. 12A, the adhesive 40 is supplied to the first principal surface 10a of the first substrate 10 and the fourth principal surface 20d of the second substrate 20. Here, the first substrate electrode 11 and the second substrate electrode 21 are also covered with the adhesive 40. As a supplying method, a method of supplying the adhesive 40 by a printing method, dispense method, or the like can be recited. Then, as depicted in FIG. 12B, the adhesive 40 is coated by a spin-coating method, bar-coating method, or the like, and drying is performed. As conditions for drying, conditions 100° C. or higher and 150° C. or lower (i.e., from 100° C. to 150° C.) and 30 seconds longer and 60 seconds or shorter (i.e., from 30 seconds to 60 seconds) are preferable.

(Laser Processing Step)

Figure 13:
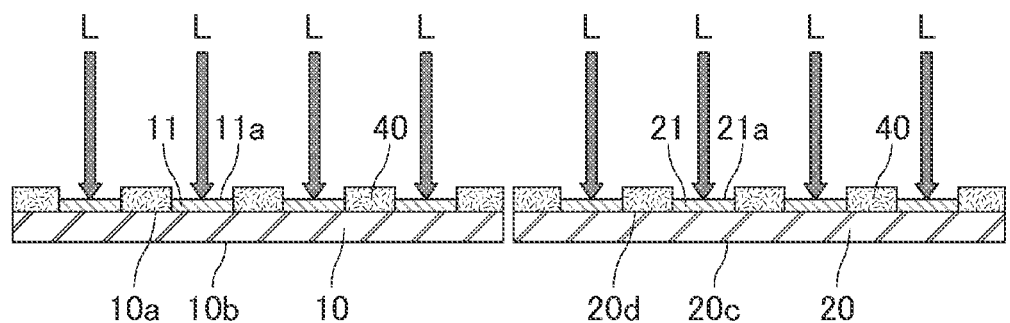
FIG. 13 is a sectional view schematically depicting one example of a laser processing step in the connection structure manufacturing method of the present disclosure.

FIG. 13 is a sectional view schematically depicting one example of the laser processing step in the connection structure manufacturing method of the present disclosure. After the above-described adhesive supplying step, as depicted in FIG. 13, laser L is applied to remove the adhesive 40 so as to expose the first substrate electrode 11 and the second substrate electrode 21. The laser processing is not particularly restrictive. For example, a method using CO2 laser or UV laser can be recited.

EXAMPLES

Examples which more specifically disclose the connection structure and the connection structure manufacturing method of the present disclosure are described below.

Note that the present disclosure is not limited only to these examples.

Example 1

(First Substrate Preparing Step and Second Substrate Preparing Step)

A first substrate was prepared, including a liquid-crystal polymer (LCP) (melting point: 250° C.; permittivity: 3.0) with p-hydroxybenzoic acid (PHB) and 6-hydroxy-2-naphthoic acid (HNA) polymerized with a molar ratio of 50:50 as a first thermoplastic resin and having a first principal surface and a second principal surface. Note that the first substrate is a flexible substrate. Then, a first substrate electrode was formed on the front surface of the first principal surface of the first substrate with a Cu foil.

A second substrate was prepared, including LCP (melting point: 250° C.; permittivity: 3.0) as a second thermoplastic resin and having a third principal surface and a fourth principal surface. Note that the second substrate is a flexible substrate. Then, a second substrate electrode was formed on the front surface of the fourth principal surface of the second substrate with a Cu foil.

(Resist Forming Step)

Next, a resist (product name: SL-1825; manufacturer: Showa Denko Materials Co., Ltd.) was formed on the first substrate electrode and the second substrate electrode.

(Surface Treatment Step)

Next, plasma treatment and surface treatment with PC-300 (oxygen gas; RF: 150 W; Flow: 12 sccm; Time: 1 min) were performed on the first principal surface of the first substrate and the fourth principal surface of the second substrate.

(Adhesive Supplying Step)

As an insulating adhesive, a polyolefin resin obtained by acid-denaturing an ethylene-propylene copolymer with methacrylic acid (product name: Arrowbase; manufacturer: UNITIKA LTD; melting point: 100° C.; permittivity: 2.4) was prepared. Next, the prepared adhesive was supplied to the first principal surface of the first substrate and the fourth principal surface of the second substrate by a dispense method. The adhesive was coated by a bar-coating method, and drying of the adhesive was performed on conditions of 100° C. and 60 seconds.

(Resist Removing Step)

Next, the resist was removed by using an alkaline solution to expose the first substrate electrode and the second substrate electrode.

(Bonding Material Supplying Step)

Next, Sn—Bi-based solder (product name: L20-BLT5-T7F; manufacturer: Senju Metal Industry Co., Ltd.) having a melting point of 140° C. was prepared, and arranged by mask printing on the exposed front surface of the first substrate electrode and front surface of the second substrate electrode.

(Bonding Step and Adhering Step)

Next, the second substrate was laminated on the first substrate so that the first principal surface of the first substrate and the second principal surface of the second substrate face each other to fabricate a multilayer body. Here, the bonding material arranged on the first substrate electrode and the bonding material arranged on the second substrate electrode were made contact with each other. Then, heating and pressurization were performed from above and below the first substrate and the second substrate with conditions of 150° C., 1 MPa, and 120 seconds. Via the above-described steps, the connection structure according to Example 1 was manufactured.

Comparative Example 1

A connection structure according to Comparative Example 1 was manufactured in a manner similar to that of Example 1 except that the heating and pressurization conditions in the bonding step and the adhering step were set as 260° C., 8 MPa, and 300 seconds.

(Position Evaluation of Substrate Electrodes)

Figure 14:
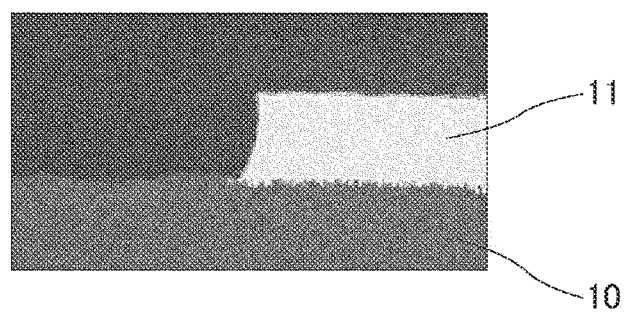
FIG. 14 is a sectional photograph of a first substrate of a multilayer body before heating and pressurization.
Figure 15:
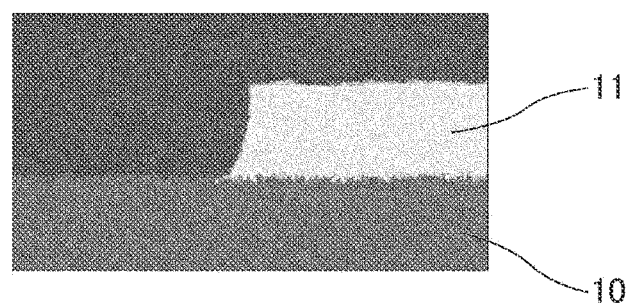
FIG. 15 is a sectional photograph of a first substrate of a connection structure according to Example 1.
Figure 16:
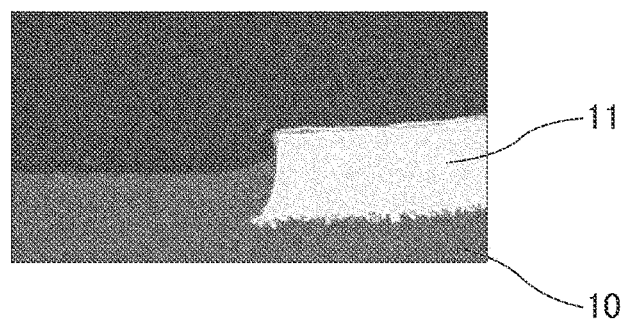
FIG. 16 is a sectional photograph of a first substrate of a connection structure according to Comparative Example 1.

A multilayer body of the first substrate and the second substrate before heating and pressurization in the bonding step and adhering step when the above-described connection structure according to Example 1 was prepared. The multilayer body was cut vertically to the first principal surface. Here, the first substrate electrode was also cut. The result of observing a cross section with a scanning electron microscope (SEM) is depicted in FIG. 14. Also, the connection structure according to Example 1 and the connection structure according to Comparative Example 1 were each cut vertically to the first principal surface. Here, each first substrate electrode was also cut. Each cross section was observed with the SEM. The results are depicted in FIG. 15 and FIG. 16. FIG. 14 is a sectional photograph of the first substrate of the multilayer body before heating and pressurization. FIG. 15 is a sectional photograph of the first substrate of the connection structure according to Example 1. FIG. 16 is a sectional photograph of the first substrate of the connection structure according to Comparative Example 1.

In comparison between FIG. 14 and FIG. 15, in the connection structure according to Example 1, sinking of the first substrate electrode was not observed. As the reason for this, it can be thought that since the heating temperature was equal to or higher than the melting point of the bonding material and the melting point of the adhesive and lower than the melting point of the first thermoplastic resin and the melting point of the second thermoplastic resin, the first substrate and the second substrate were not softened when the first substrate electrode and the second substrate electrode were bonded together and when the first principal surface of the first substrate and the fourth principal surface of the second substrate were adhered together. From this result, in the connection structure according to Example 1, it can be said that the first substrate electrode and the second substrate electrode are firmly bonded together with the bonding material without being shifted. Thus, in the connection structure according to Example 1, it can be thought that connection failure between the first substrate electrode and the second substrate electrode less tends to occur.

In comparison between FIG. 14 and FIG. 16, in the connection structure according to Comparative Example 1, sinking of the first substrate electrode was observed. As the reason for this, it can be thought that since the heating temperature was equal to or higher than the melting point of the first thermoplastic resin and the melting point of the second thermoplastic resin, the first substrate and the second substrate were softened when the first substrate electrode and the second substrate electrode were bonded together and when the first principal surface of the first substrate and the fourth principal surface of the second substrate were adhered together.

(Peel Strength Test)

Next, as for the connection structure according to Example 1, adhesion strengths of the first substrate and the second substrate were measured by the following method.

Figure 17:
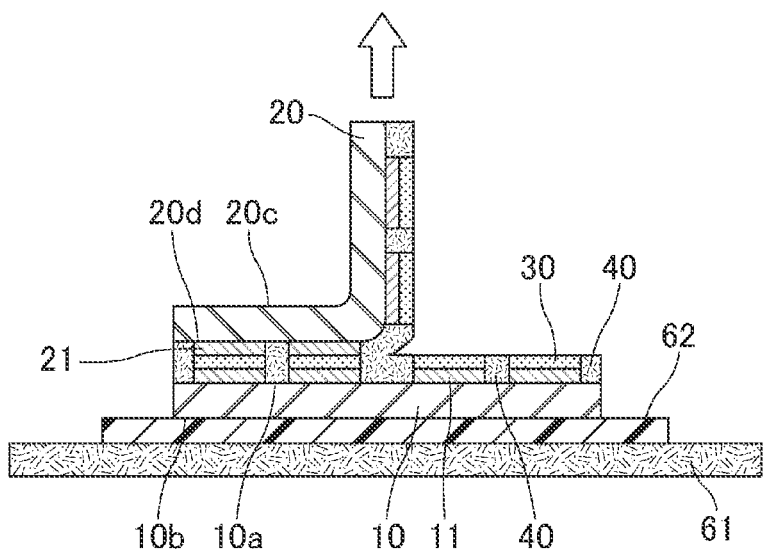
FIG. 17 is a sectional view schematically depicting a method of a peel strength test.

FIG. 17 is a sectional view schematically depicting a method of a peel strength test. As depicted in FIG. 17, a double-sided tape was affixed to an upper surface of an FR-1 substrate 62 as a printed board arranged on a stage 61, and the connection structure 1 was adhered thereon so as to be in contact with the second principal surface 10b of the first substrate 10. Next, an end portion of the second substrate 20 was peeled off, a force was applied upward so that a peeled-off portion of the second substrate 20 is perpendicular to the first principal surface 10a of the first substrate 10, and peel strength was measured. In peel strength measurement, a tensile tester (device name: TENSILON; manufacturer: A&D Company, Limited) was used, and the measurement was performed with measurement conditions of load cell: 5 kg and tension speed: 5 mm/min. The measurement was performed twice. The results are depicted in FIG. 18.

Figure 18:
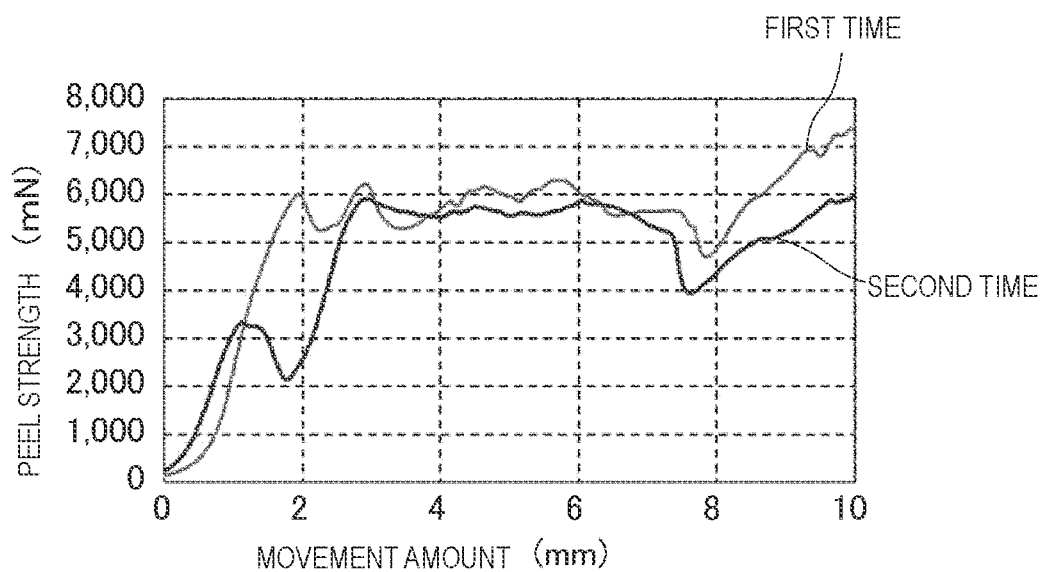
FIG. 18 is a chart illustrating the results of the peel strength test.

FIG. 18 is a chart illustrating the results of the peel strength test (n=2). As depicted in FIG. 18, in the connection structure according to Example 1, it was found that sufficient peel strengths can be ensured. Since these peel strengths can be ensured, conductivity failure and connection failure can be prevented.

What is claimed is:

1. A connection structure comprising:
   a first substrate which has a first principal surface and a second principal surface opposed to the first principal surface and includes a first thermoplastic resin;
   a first substrate electrode on the first principal surface;
   a second substrate which has a third principal surface and a fourth principal surface opposed to the third principal surface and facing the first principal surface and includes a second thermoplastic resin;
   a second substrate electrode on the fourth principal surface;
   a bonding material which is conductive and bonds the first substrate electrode and the second substrate electrode together; and
   an adhesive which has insulating properties and adheres together the first principal surface other than a portion where the first substrate electrode is disposed and the fourth principal surface other than a portion where the second substrate electrode is disposed, wherein
   a bonding temperature of the bonding material is lower than a melting point or a glass transition temperature of the first thermoplastic resin and lower than a melting point or a glass transition temperature of the second thermoplastic resin, and an adhesion temperature of the adhesive is lower than the melting point or the glass transition temperature of the first thermoplastic resin and lower than the melting point or the glass transition temperature of the second thermoplastic resin.

2. The connection structure according to claim 1, wherein the adhesive includes a polyolefin resin.

3. The connection structure according to claim 1, wherein permittivity of the adhesive is lower than permittivity of the first thermoplastic resin and permittivity of the second thermoplastic resin.

4. The connection structure according to claim 1, wherein the bonding material includes a sintered body of conductive paste including metal nanoparticles, and the bonding temperature of the bonding material is a sintering temperature of the metal nanoparticles.

5. The connection structure according to claim 1, wherein the bonding material includes lead-free solder, and the bonding temperature of the bonding material is a melting point of the lead-free solder.

6. The connection structure according to claim 1, wherein the bonding material includes a conductive adhesive including conductive particles and a thermoplastic resin, and the bonding temperature of the bonding material is a thermosetting temperature of the thermoplastic resin.

7. The connection structure according to claim 1, wherein a first substrate block with a plurality of substrates including the first substrate laminated and a second substrate block with a plurality of substrates including the second substrate laminated are connected together.

8. The connection structure according to claim 7, further comprising:

a third substrate block with a plurality of substrates laminated which is connected to the first substrate of the first substrate block.

9. The connection structure according to claim 8, wherein the third substrate block includes a third substrate which has a fifth principal surface and a sixth principal surface opposed to the fifth principal surface and facing the first principal surface and includes a third thermoplastic resin, and a third substrate electrode on the sixth principal surface, the first substrate electrode and the third substrate electrode are bonded together with the bonding material, the first principal surface other than the portion where the first substrate electrode is disposed and the sixth principal surface other than a portion where the third substrate electrode is disposed are adhered together with adhesive, the bonding temperature of the bonding material is lower than the melting point or the glass transition temperature of the first thermoplastic resin and lower than a melting point or a glass transition temperature of the third thermoplastic resin, and the adhesion temperature of the adhesive is lower than the melting point or the glass transition temperature of the first thermoplastic resin and lower than the melting point or the glass transition temperature of the third thermoplastic resin.

10. The connection structure according to claim 2, wherein
permittivity of the adhesive is lower than permittivity of the first thermoplastic resin and permittivity of the second thermoplastic resin.

11. The connection structure according to claim 2, wherein
the bonding material includes a sintered body of conductive paste including metal nanoparticles, and the bonding temperature of the bonding material is a sintering temperature of the metal nanoparticles.

12. The connection structure according to claim 3, wherein
the bonding material includes a sintered body of conductive paste including metal nanoparticles, and the bonding temperature of the bonding material is a sintering temperature of the metal nanoparticles.

13. The connection structure according to claim 2, wherein
the bonding material includes lead-free solder, and the bonding temperature of the bonding material is a melting point of the lead-free solder.

14. The connection structure according to claim 3, wherein
the bonding material includes lead-free solder, and the bonding temperature of the bonding material is a melting point of the lead-free solder.

15. The connection structure according to claim 2, wherein
the bonding material includes a conductive adhesive including conductive particles and a thermoplastic resin, and the bonding temperature of the bonding material is a thermosetting temperature of the thermoplastic resin.

16. The connection structure according to claim 3, wherein
the bonding material includes a conductive adhesive including conductive particles and a thermoplastic resin, and the bonding temperature of the bonding material is a thermosetting temperature of the thermoplastic resin.

17. The connection structure according to claim 2, wherein
a first substrate block with a plurality of substrates including the first substrate laminated and a second substrate block with a plurality of substrates including the second substrate laminated are connected together.

18. The connection structure according to claim 3, wherein
a first substrate block with a plurality of substrates including the first substrate laminated and a second substrate block with a plurality of substrates including the second substrate laminated are connected together.

19. A connection structure manufacturing method comprising:

preparing a first substrate which has a first principal surface and a second principal surface opposed to the first principal surface, includes a first substrate electrode on the first principal surface, and includes a first thermoplastic resin;

preparing a second substrate which has a third principal surface and a fourth principal surface opposed to the third principal surface, includes a second substrate electrode on the fourth principal surface, and includes a second thermoplastic resin;

bonding the first substrate electrode and the second substrate electrode together with a bonding material which is conductive; and adhering the first principal surface other than a portion where the first substrate electrode is disposed and the fourth principal surface other than a portion where the second substrate electrode is disposed together with an adhesive which has insulating properties, wherein the bonding is performed at a temperature lower than a melting point or a glass transition temperature of the first thermoplastic resin and lower than a melting point or a glass transition temperature of the second thermoplastic resin, and the adhering is performed at a temperature lower than the melting point or the glass transition temperature of the first thermoplastic resin and lower than the melting point or the glass transition temperature of the second thermoplastic resin.

20. The connection structure manufacturing method according to claim 19, wherein the bonding and the adhering are simultaneously performed.

* * * * *